United States Patent
Strmiska et al.

(10) Patent No.: US 7,295,447 B2
(45) Date of Patent: Nov. 13, 2007

(54) COMPONENT CAM HANDLE

(75) Inventors: Bernard Strmiska, Round Rock, TX (US); Keith J. Kasprzak, Cedar Park, TX (US)

(73) Assignee: Dell Products L.P., Round Rock, TX (US)

( * ) Notice: Subject to any disclaimer, the term of this patent is extended or adjusted under 35 U.S.C. 154(b) by 109 days.

(21) Appl. No.: 11/170,922

(22) Filed: Jun. 30, 2005

(65) Prior Publication Data

US 2007/0002550 A1 Jan. 4, 2007

(51) Int. Cl.
*H05K 7/12* (2006.01)
*H05K 7/14* (2006.01)

(52) U.S. Cl. ............... 361/798; 361/754; 361/801; 361/759; 361/747; 312/223.2

(58) Field of Classification Search ............... 361/726, 361/732, 740, 747, 759, 754, 798, 801; 312/223.2, 312/223.3; 29/830
See application file for complete search history.

(56) References Cited

U.S. PATENT DOCUMENTS

| | | | | |
|---|---|---|---|---|
| 5,003,431 A * | 3/1991 | Imsdahl | ............... | 361/798 |
| 5,414,594 A * | 5/1995 | Hristake | ............... | 361/755 |
| 5,481,431 A | 1/1996 | Siahpolo et al. | ............... | 361/685 |
| 5,587,879 A | 12/1996 | Spano et al. | ............... | 361/685 |
| 5,949,652 A | 9/1999 | McAnally et al. | ............... | 361/726 |
| 6,069,790 A | 5/2000 | Howell et al. | ............... | 361/686 |
| 6,147,878 A * | 11/2000 | Heselton | ............... | 361/798 |
| 6,186,819 B1 | 2/2001 | Holub | ............... | 439/358 |
| 6,266,248 B1 * | 7/2001 | Hanas et al. | ............... | 361/752 |
| 6,312,275 B1 * | 11/2001 | Tortorella | ............... | 439/341 |
| 6,354,164 B1 * | 3/2002 | Megason et al. | ............... | 74/109 |
| 6,381,146 B1 * | 4/2002 | Sevier | ............... | 361/754 |
| 6,406,309 B1 | 6/2002 | Ennis et al. | ............... | 439/152 |
| 6,431,612 B1 | 8/2002 | Bastian | ............... | 292/80 |
| 6,454,355 B2 | 9/2002 | Biletskiy | ............... | 297/378.12 |
| 6,490,153 B1 * | 12/2002 | Casebolt et al. | ............... | 361/685 |
| 6,567,274 B1 * | 5/2003 | Tusan et al. | ............... | 361/740 |
| 6,821,024 B2 | 11/2004 | Bates, III | ............... | 385/76 |
| 6,912,124 B2 * | 6/2005 | Megason et al. | ............... | 361/685 |
| 6,992,900 B1 * | 1/2006 | Suzue et al. | ............... | 361/801 |
| 7,027,309 B2 * | 4/2006 | Franz et al. | ............... | 361/798 |

* cited by examiner

*Primary Examiner*—Dean A Reichard
*Assistant Examiner*—Dameon E. Levi
(74) *Attorney, Agent, or Firm*—Baker Botts L.L.P.

(57) ABSTRACT

A cam handle assembly for use with a modular information handling system components includes a latch with first protrusion and a second protrusion. The first protrusion is sloped such that when the sloped portion of the first protrusion contacts a portion of a rack or chassis, the latch is urged to a recessed position that will allow the cam handle to move between its closed and open position. The second protrusion on the latch is formed to engage an interface aperture that is formed in the cam handle. The interaction between the latch protrusions, the cam handle and the rack encourage proper operation of the cam handle to install an information handling system component within a rack.

20 Claims, 4 Drawing Sheets

COMPONENT CAM HANDLE

TECHNICAL FIELD

The present invention is related to the field of computer systems and more specifically to a cam handle for use with an information handling system component.

BACKGROUND OF THE INVENTION

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

Many information handling systems utilize modular information handling system components such as modular power supply components, processing resources and modular fans, all of which may be stored within a rack, multiple racks, or a system chassis. Modular information handling system components such as power supplies and other Field Replaceable Units (FRUs) often incorporate camming assemblies including cam handles for use in installing the modular component within a rack. The modular information handling system components are typically shipped with the handle in the closed position. Because of this, the modular component may be inserted directly into a rack system without first unlatching the cam handle and moving it through its full range of motion to a fully open position. In other words, it is possible to remove the modular component from its shipping package and slide it into the chassis without actually camming the modular component into its fully engaged position. Without utilizing the cam handle to cam the modular component into a fully engaged position, the modular component may become disengaged and the system may experience connectivity problems.

SUMMARY OF THE INVENTION

Therefore a need has arisen for an improved system and method for installing modular components within a rack system. A further need has arisen for a cam assembly that ensures proper usage of the cam handle during installation of a modular component within a rack system.

The present disclosure describes a cam handle assembly for use with a modular information handling system components that includes a latch with first protrusion and a second protrusion. The first protrusion is sloped such that when the sloped portion of the first protrusion contacts part of a rack, the latch is urged to a recessed position that will allow the cam handle to move between its closed and open position. The second protrusion on the latch is formed to engage an interface aperture that is formed in the cam handle.

In one aspect an information handling system is disclosed that includes a modular information handling system component. A cam handle is attached to the modular information handling system component and is rotatable between a closed position and an open position. A latch is provided on the modular information handling system component and is moveable between an engaged position and a recessed position. The latch includes a first protrusion and a second protrusion. The first protrusion has a sloped portion that acts to urge the latch to the recessed position when it is contacted by another portion of the information handling system. The second protrusion is formed to engage an interface aperture formed in the cam handle.

In another aspect, a cam assembly is disclosed for use with an information handling system component. The cam handle includes an interface aperture formed within the handle. The cam handle is formed to rotatably couple to a portion of an information handling system component such that the cam handle may rotate between a closed position and an open position. The cam assembly also includes a latch with a first protrusion and a second protrusion. The latch is moveable between an engagement position and a recessed position. The first protrusion has a sloped portion that is formed to urge the latch towards the recessed position when the first protrusion interacts with a portion of an information handling system and the second protrusion is formed to engage the interface aperture within the cam handle.

In yet another aspect, a method for inserting an information handling system component within a rack system includes rotatably coupling a cam handle to a modular information handling system component such that the cam handle may rotate between a closed position and open position. The method also includes forming an interface aperture within the cam handle and providing a latch that includes a first protrusion and a second protrusion where the latch is moveable between an engaged position and a recessed position. The first protrusion is formed with a sloped portion that acts to urge the latch towards the recessed position when the first protrusion interacts with a portion of an information handling system. The second protrusion is formed to engage the interface aperture formed in the cam handle.

The present disclosure includes a number of important technical advantages. One important technical advantage is providing a latch that includes a first protrusion and a second protrusion as described. The first protrusion and second protrusion ensure that the cam assembly is properly operated during the installation of an information handling system component within a rack system such that the cam assembly will act to cam the information handling system component to a fully engaged or fully inserted position. Additional advantages will be apparent to those of skill in the art and from the figures, description and claims provided herein.

BRIEF DESCRIPTION OF THE DRAWINGS

A more complete and thorough understanding of the present embodiments and advantages thereof may be acquired by referring to the following description taken in conjunction with the accompanying drawings, in which like reference numbers indicate like features, and wherein.

DETAILED DESCRIPTION OF THE INVENTION

Preferred embodiments of the invention and its advantages are best understood by reference to FIGS. 1–4 wherein like numbers refer to like and corresponding parts and like element names to like and corresponding elements.

For purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, or other purposes. For example, an information handling system may be a personal computer, a network storage device, or any other suitable device and may vary in size, shape, performance, functionality, and price. The information handling system may include random access memory (RAM), one or more processing resources such as a central processing unit (CPU) or hardware or software control logic, ROM, and/or other types of nonvolatile memory. Additional components of the information handling system may include one or more disk drives, one or more network ports for communicating with external devices as well as various input and output (I/O) devices, such as a keyboard, a mouse, and a video display. The information handling system may also include one or more buses operable to transmit communications between the various hardware components.

Figure 1:
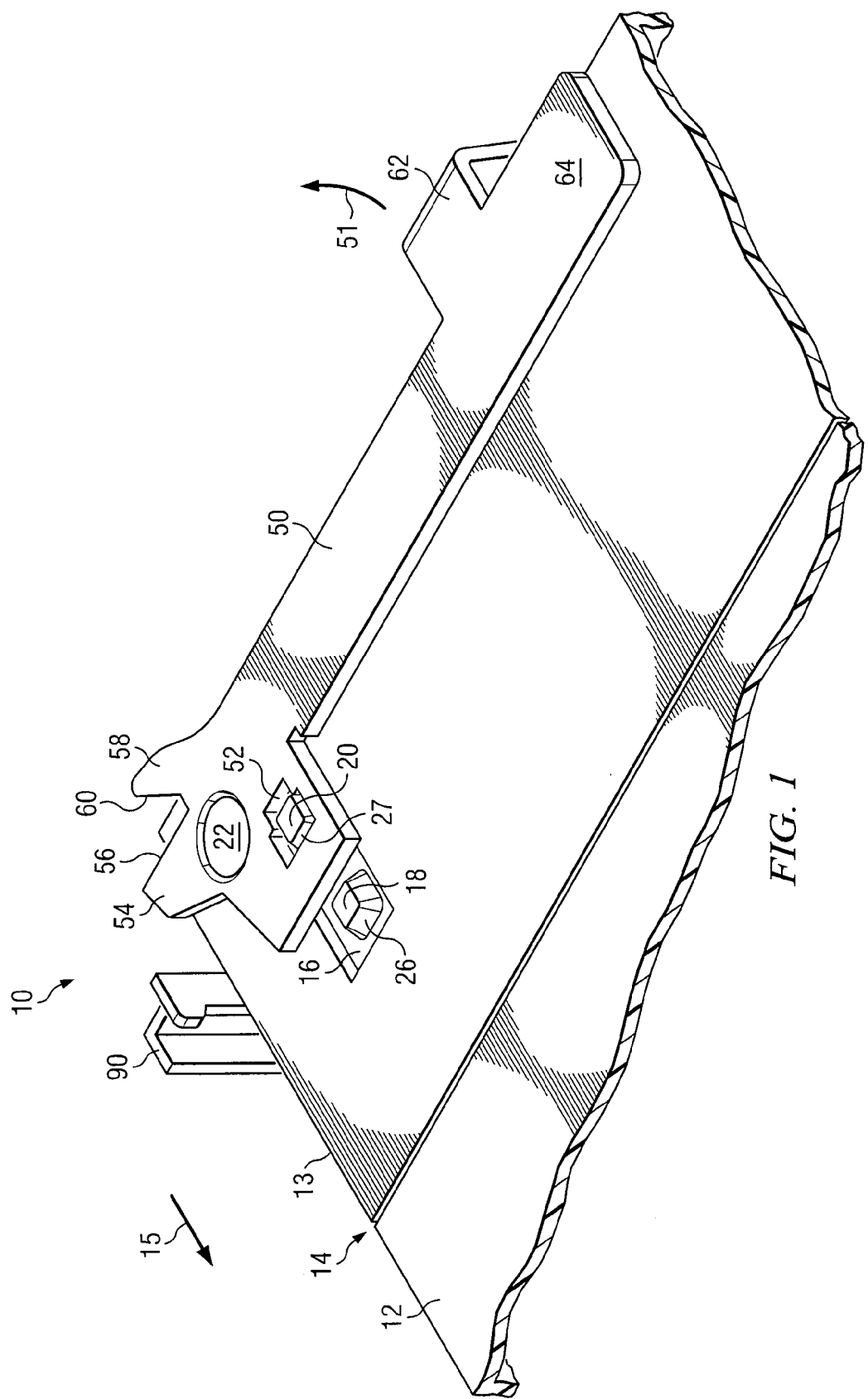
FIG. 1 shows a perspective view of a cam handle installed on a modular information handling system component in a closed position according to teachings of the present disclosure.

Now referring to FIG. 1, an information handling system indicated generally at 10 is shown. Information handling system 10 generally includes modular information handling system component (which may be referred to herein as a modular component or simply a component) 12, cam handle 50, latch 16 and rack portion 90. Information handling system component 12 may be any suitable information handling system component such as, but not limited to, a power supply or an FRU. In the present disclosure an FRU may be any component that can be replaced or installed in the field by a user, service technicians, etc. FRU may be, for instance, fans, memory cards or modules, printed wire boards, drives, or any other component that is docked. Information handling system component 12 includes an edge 13 and a groove 14 formed across a front portion of component 12. Component 12 is preferably inserted into rack 90 in the direction of arrow 15 to be properly installed within information handling system 10. A cam assembly including latch 16 and cam handle 50 is included to allow information handling system component 12 to be properly (fully) inserted within rack 90.

Figure 3:
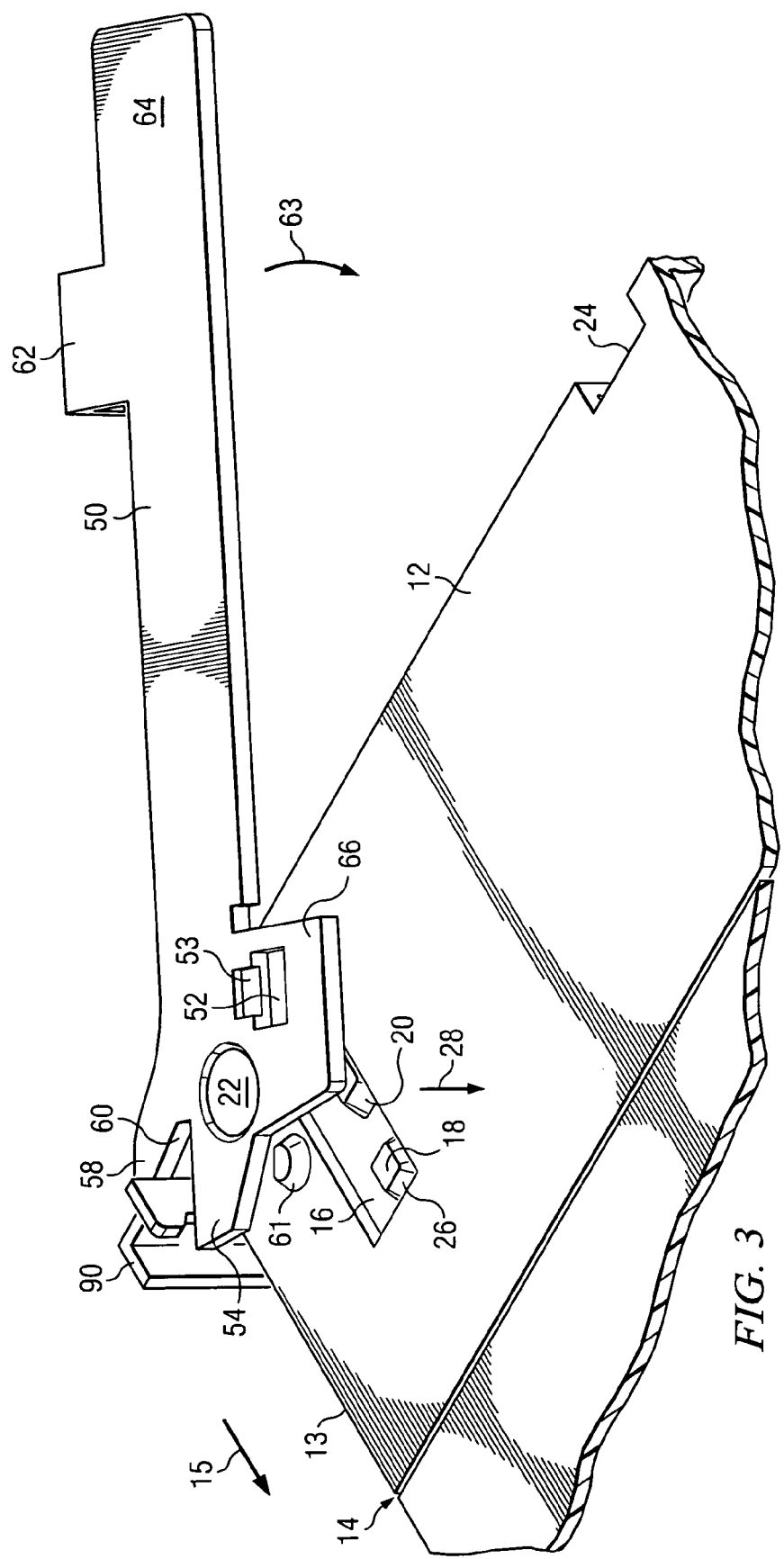
FIG. 3 shows an information handling system component with a cam handle in an intermediate position between and open and closed position.

Latch 16 is provided within a recess within the front portion of information handling system component 12. Latch 16 generally includes a first protrusion 18 and a second protrusion 20. Latch 16 is generally moveable between an engaged position as shown and an opened or recessed position as shown in FIG. 3.

Figure 4:
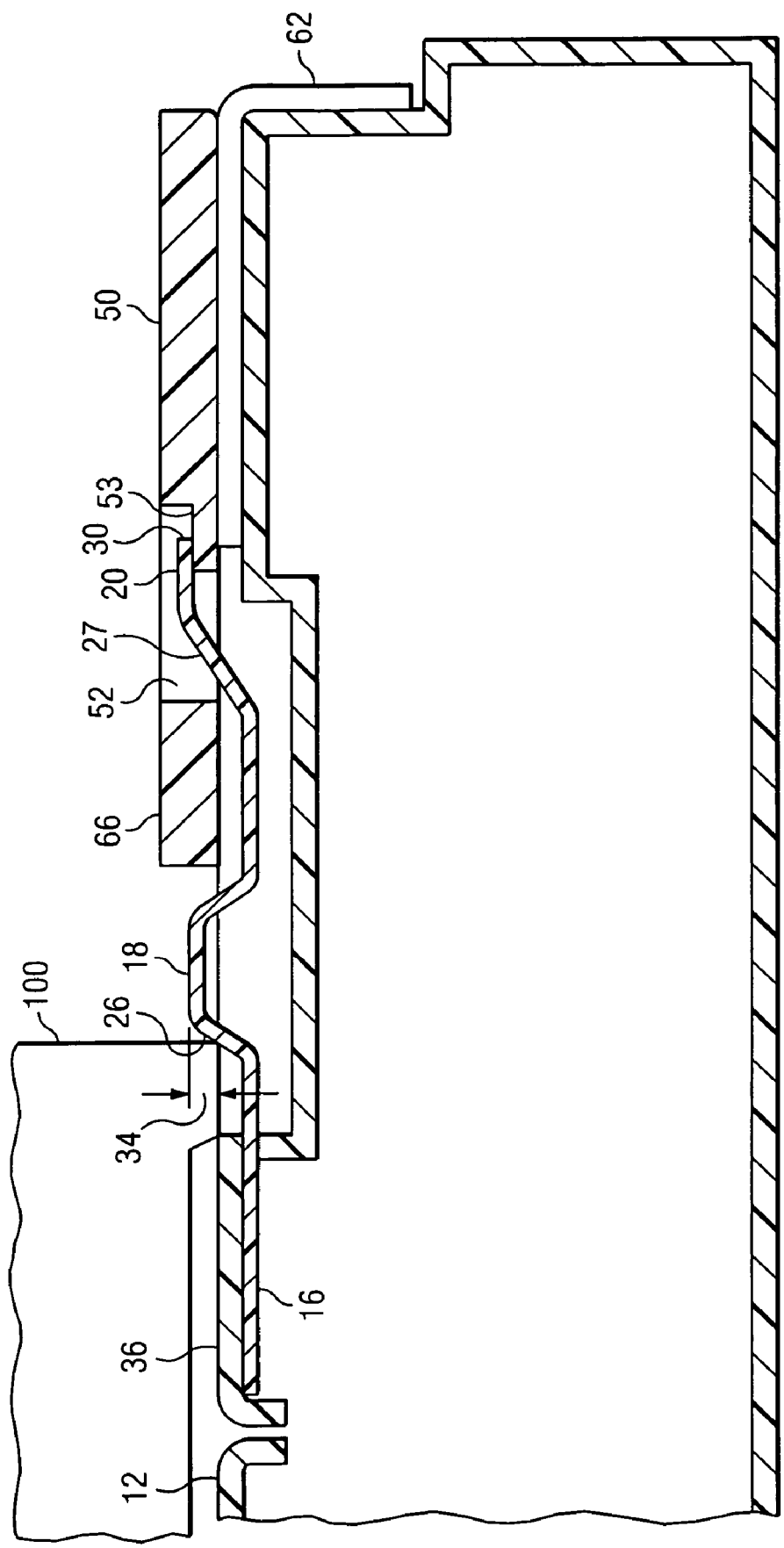
FIG. 4 shows a cutaway side view of a latch interfacing with a portion of the cam handle according to teachings of the present disclosure.

First protrusion 18 includes sloped portion 26 (which may also be referred to herein as a sloped edge) that is provided and positioned such that as information handling system component 12 is inserted within rack 90, sloped portion 26 will contact another portion of a rack or an information handling system chassis 100 (as shown and described in FIG. 4). As sloped portion 26 contacts portion of information handling system chassis 100, latch 16 is urged downward into a recessed position. As described herein, the terms "rack" and "chassis" may be used interchangeably. For instance, portion of rack 90 may be a portion of an equipment rack such as are typically used in data centers. Portion of rack 90 may also be an interior portion of a chassis or enclosure. Similarly, information handling system chassis 100 may be a portion of an information handling system chassis or enclosure. Alternately, information handling system chassis 100 may be a portion of a rack in which component 12 is being inserted.

Latch 16 also includes second protrusion 20 which includes a sloped portion 27 along a rear portion of second protrusion 20 and a lip 30 on the front portion of second protrusion 20. Second protrusion 20 is generally formed and sized to fit within interface aperture 52 formed within cam handle 50. Sloped edge 27 is formed and positioned such that, as cam handle 50 is rotated in the direction of arrow 51, second protrusion 20 is urged downward into recessed position. This may cause the second protrusion 20 to become disengaged which allows cam handle 50 to move from a closed position as shown in FIG. 1 to an open position as shown in FIG. 2.

Cam handle 50 includes an elongated body rotatably coupled at one end by a fastener 22. Cam handle 50 has end 64 (opposite the coupled end) and a tab 62 extending forward and downward to prevent cam handle 50 from over rotating onto the top surface of information handling system component 12. Cam handle 50 further includes a first arm 54 and a second arm 58. When cam handle 50 is in the closed position, as shown, first arm 54 extends beyond edge 13 such that first arm 54 will contact a portion of rack 90, thereby preventing the insertion of information handling system component 12 into rack 90 with cam handle 50 in the closed position.

In operation, as information handling system component 12 is installed within rack 90, the cam handle 50 is initially in a closed position (which may also be referred to as a "shipping position") as shown in FIG. 1. The information handling system component 12 is inserted into rack 90 in the direction of arrow 15 until the contact between rack portion 90 and first arm 54 prevents further insertion. At this time, an operator may preferably rotate cam handle 50 in the direction of arrow 51. This rotation preferably causes an edge portion of interface aperture 52 to contact the sloped edge 27 of second protrusion 20 urging latch 16 into a recessed position thereby allowing cam handle 50 to swing forward. Cam handle 50 preferably then swings to an open position as shown in FIG. 2.

Figure 2:
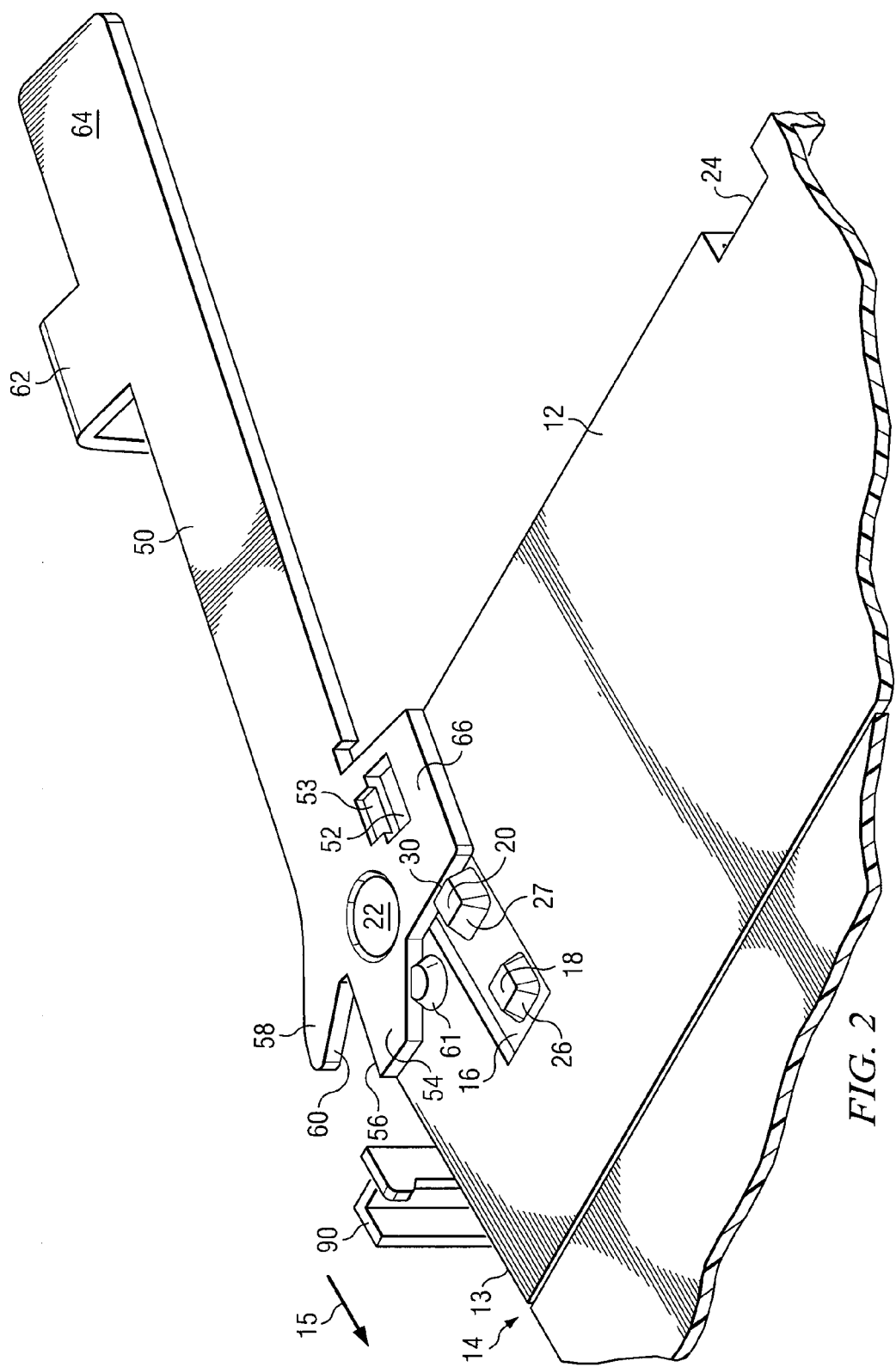
FIG. 2 shows a cam handle coupled with a modular information handling system component in an open position.

Now referring to FIG. 2, an information handling system component 12 with cam handle 50 shown in an open position is shown. In the open position shown in FIG. 2, first arm 54 rests against stop member 61. In this position, first arm 54 is positioned such that it does not substantially extend over edge portion 13 and does not contact portion of rack 90. In this manner, information handling system component 12 may then be inserted further in the direction of 15 until rack portion 90 contacts edge 60 of second arm 58.

In a preferred embodiment, as information handling system component 12 is inserted within rack 90 in the direction of arrow 15, rack portion 90 is selectively positioned adjacent edge 60 of second arm 58. In one preferred embodiment, at substantially the same time, a portion of information handling system chassis 100 (as shown in FIG. 4) contacts sloped portion 26 of first protrusion 18. This contact preferably urges latch 16 to a recessed position as shown in FIG. 3, thereby allowing cam handle 50 to be rotated to a closed position.

In operation, after information handling system component 12 is inserted in the direction of arrow 15 until rack 90 is selectively positioned adjacent to edge 60, as described above, the user may then rotate cam 50 in the direction of arrow 63 until cam handle 50 is in an intermediate position as shown in FIG. 3 such that a portion 66 of cam handle 50 is positioned over second protrusion 20. This position may preferably ensure that latch 16 is maintained within its recessed position. Additionally as cam handle 50 is rotated from the open position as shown in FIG. 2 to the intermediate position shown in FIG. 3 and then to a fully closed position as shown in FIG. 1, edge 56 of first arm 54 of cam handle 50 preferably cams information handling system component 12 further in the direction of arrow 15 such that information handling system component 12 is urged to a fully engaged position within rack 90.

Now referring to FIG. 3, cam 50 is positioned in an intermediate position such that a portion of cam handle 66 is positioned on top of second protrusion 28, preventing latch 16 from moving from the recessed position (as shown) to an engaged position. As cam handle 50 rotates back to the closed position as shown in FIG. 1, tab 62 will nest within notch 24 formed within the front portion of information handling system component 12. Additionally, second protrusion 20 may preferably align with interface aperture 52 such that latch 16 will then be urged by the spring bias of latch 16 to the engaged position. Preferably, second protrusion 20 becomes inserted within interface aperture 52 as latch 16 moves into the engaged position. In the present embodiment, latch 16 comprises a leaf spring incorporated into the exterior of modular information handling system component 12 that is suitable for providing sufficient bias to urge latch 16 from the recessed position to the engaged position.

Interface aperture 52 also includes a notch 53 formed therein. In the present embodiment, notch 53 is preferably sized such that lip 30 of protrusion 20 engages notch 53 as shown in FIG. 4.

Now referring to FIG. 4, a cross-section view of latch 16 interfaced with cam handle 50 is shown. Second protrusion 20 includes lip 30 inserted within notch portion 53 of interface aperture 52. In this position (where cam handle 50 is in a closed position as shown in FIG. 1) the interface between lip 30 and notch 53 prevents movement of latch 16 from its present engaged position to a recessed position. In the present engaged position, first protrusion 18 and second protrusion 20 are positioned above the top surface of interface handling system component 20 by an offset height 34. As information handling system 20 is inserted within a rack a portion of an information handling system 10 such as a portion of the rack or a portion of the chassis as shown herein at 100 is positioned to contact and interface with sloped portion 26 of first protrusion 18. In the present particular embodiment, chassis 100 includes protrusion 110 for selectively contacting sloped portion 26 to selectively urge latch 16 into a recessed position allowing cam handle 50 to rotate. After information handling system component is inserted further within rack 90, protrusion 18 preferably pushes past protrusion 110, allowing latch to again be urged to the engaged position by the bias of latch 16.

As described above, latch 16 serves both as a key and a stop to prevent component 12 from being installed without using cam handle 50. With cam handle 50 in the closed position, component 12 cannot be inserted into rack 90 due to an intentional interference between the latch assembly and chassis 100. Latch 16 interlocks with the cam handle 50 to prevent deflection. When latch 16 and handle 50 are interlocked, protrusion 18 will preferably interfere with chassis 100. With cam handle 50 in open position, latch 16 may deflect out of the way of handle 50. Once cam handle 50 is opened, it can be used to cam modular component 12 to a fully inserted position in rack 90.

As modular component 12 is inserted into rack 90, a portion of chassis 100 contacts protrusion 18, causing latch 16 to deflect to a recessed position. If the modular component is installed upside down, there will be no such portion of chassis 100 present to contact protrusion 18, and latch 16 will not be deflected to a recessed position. Hence, cam handle 50 will be locked in the open position and component 12 cannot be inserted into rack 90 until oriented properly.

When in the closed position which may also be referred to as a "shipping position," latch 16 cannot deflect in order to allow cam handle 50 to close. With cam handle 50 in the open position, cam handle 50 can only rotate when it is properly installed in rack 90.

Although the disclosed embodiments have been described in detail, it should be understood that various changes, substitutions and alterations can be made to the embodiments without departing from their spirit and scope.

What is claimed is:

1. An information handling system comprising:
   a modular information handling system component;
   a cam handle having an interface aperture formed therein, the cam handle coupled to the modular information handling system component and rotatable between a closed position and an open position;
   a latch having a first protrusion and a second protrusion, the latch movable between an engagement position and a recessed position;
   the first protrusion having a sloped portion operable to urge the latch to the recessed position when the first protrusion interacts with a portion of an information handling system rack; and
   the second protrusion formed to engage the cam handle interface aperture.

2. An information handling system according to claim 1 wherein the latch comprises a leaf spring.

3. An information handling system according to claim 1 wherein the modular information handling system component comprises a power supply.

4. An information handling system according to claim 1 wherein the modular information handling system component comprises a modular fan assembly.

5. An information handling system according to claim 1 wherein the recessed position of the latch allows the cam handle to rotate between the open position and the closed position.

6. An information handling system according to claim 1 wherein the second protrusion comprises a sloped portion formed such that interaction with a portion of the interface aperture urges the latch to the recessed position, thereby allowing the cam handle to rotate from the closed position to the open position.

7. An information handling system according to claim 1 wherein:
the interface aperture comprises a notch formed therein; and
the second protrusion having a lip extending therefrom and sized to fit within the notch.

8. An information handling system according to claim 7 further comprising the notch operable to prevent movement of the latch from the engagement position to the recessed position while the cam handle is in the closed position.

9. An information handling system according to claim 1 wherein:
the cam handle further comprises a first arm and a second arm extending therefrom;
the first arm extending from an edge of the modular information handling system component when the cam handle is in the closed position, thereby preventing complete insertion of the modular component into a rack system;
the second arm offset from the first arm and formed such that a portion of second arm extends from the edge of the modular information handling system when the latch is positioned in the open position, such that the modular information handling component is selectively positioned with respect to the rack system.

10. An information handling system according to claim 9 wherein the first arm is positioned with respect to the second arm such that, after the modular component is positioned in the selected position, movement of the cam handle from the open position to the closed position causes the first arm to contact a portion of the rack, thereby urging the modular information handling system into a fully inserted position within the rack.

11. A cam assembly for use with an information handling system component comprising:
a cam handle having an interface aperture formed therein, the cam handle formed to couple to a portion of an information handling system component such that the cam handle is rotatable between a closed position and an open position;
a latch having a first protrusion and a second protrusion, the latch movable between an engagement position and a recessed position;
the first protrusion having a sloped portion operable to urge the latch to the recessed position when the first protrusion interacts with a portion of an information handling system rack; and
the second protrusion formed to engage the cam handle interface aperture.

12. A cam assembly according to claim 11 wherein the latch comprises a leaf spring.

13. A cam assembly according to claim 11 wherein the recessed position of the latch allows the cam handle to rotate between the open position and the closed position.

14. A cam assembly according to claim 11 wherein the second protrusion comprises a sloped portion formed such that interaction with a portion of the interface aperture urges the latch to the recessed position, thereby allowing the cam handle to rotate from the closed position to the open position.

15. A cam assembly according to claim 11 wherein:
the interface aperture comprises a notch formed therein; and
the second protrusion having a lip extending therefrom and sized to fit within the notch.

16. A cam assembly according to claim 15 further comprising the notch operable to prevent movement of the latch from the engagement position to the recessed position while the cam handle is in the closed position.

17. A method for installing an information handling system component within a rack system comprising:
rotatably coupling a cam handle to a modular information handling system component such that the cam handle rotates between a closed position and an open position;
forming an interface aperture in the cam handle; and
providing a latch having a first protrusion and a second protrusion, the latch movable between an engagement position and a recessed position, the first protrusion having a sloped portion operable to urge the latch to the recessed position when the first protrusion interacts with a portion of an information handling system rack and the second protrusion formed to engage the cam handle interface aperture.

18. A method according to claim 17 wherein providing the latch comprises providing a leaf spring.

19. A method according to claim 17 further comprising moving the latch to the recessed position thereby allowing the cam handle to rotate between the open position and the closed position.

20. A method according to claim 17 wherein the second protrusion comprises a sloped portion formed such that interaction with a portion of the interface aperture urges the latch to the recessed position, thereby allowing the cam handle to rotate from the closed position to the open position.

* * * * *